(12) United States Patent
Darolia

(10) Patent No.: US 6,255,001 B1
(45) Date of Patent: Jul. 3, 2001

(54) BOND COAT FOR A THERMAL BARRIER COATING SYSTEM AND METHOD THEREFOR

(75) Inventor: Ramgopal Darolia, West Chester, OH (US)

(73) Assignee: General Electric Company, Cincinnati, OH (US)

(*) Notice: Subject to any disclaimer, the term of this patent is extended or adjusted under 35 U.S.C. 154(b) by 0 days.

(21) Appl. No.: 09/232,518

(22) Filed: Jan. 19, 1999

Related U.S. Application Data

(63) Continuation-in-part of application No. 08/932,304, filed on Sep. 17, 1997, now abandoned.

(51) Int. Cl.[7] .............................. B32B 15/04; C23C 16/00
(52) U.S. Cl. ...................... 428/610; 428/621; 428/623; 428/632; 428/633; 428/652; 428/678; 428/679; 428/680; 416/241 R; 427/405; 427/250; 427/456; 427/566; 204/192
(58) Field of Search ..................... 428/610, 621, 428/623, 632, 633, 652, 678, 679, 680; 416/241 R; 427/250, 456, 566, 405; 204/192

(56) References Cited

U.S. PATENT DOCUMENTS

| | | | |
|---|---|---|---|
| 4,087,589 | * 5/1978 | Bessen | 428/596 |
| 4,610,736 | 9/1986 | Barrett et al. | 420/460 |
| 4,612,165 | 9/1986 | Liu et al. | 420/460 |
| 4,731,221 | 3/1988 | Lie | 420/460 |
| 4,758,480 | * 7/1988 | Hecht et al. | 428/680 |
| 5,037,070 | 8/1991 | Druschitz et al. | 266/280 |
| 5,108,700 | 4/1992 | Lie | 420/445 |
| 5,238,752 | 8/1993 | Duderstadt et al. | 428/633 |
| 5,302,465 | 4/1994 | Miller et al. | 428/552 |
| 5,334,263 | 8/1994 | Schaeffer | 428/610 |
| 5,419,971 | 5/1995 | Skelly et al. | 428/632 |
| 5,498,484 | 3/1996 | Duderstadt | 428/632 |
| 5,705,280 | * 1/1998 | Doty | 428/539.5 |
| 5,759,640 | 6/1998 | Mannava et al. | 427/554 |
| 5,975,852 | * 11/1999 | Nagaraj et al. | 416/241 R |
| 6,022,632 | * 2/2000 | Olson et al. | 428/650 |

FOREIGN PATENT DOCUMENTS

| | | |
|---|---|---|
| 471505 | 2/1992 | (EP). |
| WO 97/29219 | 8/1997 | (WO). |

OTHER PUBLICATIONS

Pint et al., Evaluation of TBC–Coated B–NiAl Substrates without a Bond Coat, Elevated Temperature Coatings: Science and Tech. II, The Minerals, Metals and Materials Society (1996) p. 163–173. (No Month).

Pint et al., Substrate and Bond Coat Compositions: Factors Affecting Alumina Scale Adhesion, NIST TBC Workshop 1997, Cincinnati, OH (May 19–21, 1997) p. 109–125.

U.S. application No. 08/786,814—Heaney et al—filing date Jan. 21, 1997.

* cited by examiner

Primary Examiner—Timothy M. Speer
Assistant Examiner—Bryant Young
(74) Attorney, Agent, or Firm—Andrew C. Hess; David L. Narciso

(57) ABSTRACT

A thermal barrier coating system and a method for forming the coating system on an article. The coating system employs a bond coat of a nickel aluminide alloy over which a thermal-insulating ceramic layer is deposited. The nickel aluminide bond coat contains zirconium, but is otherwise predominantly of the beta (β) NiAl phase. The bond coat is preferably deposited by a physical vapor deposition process to have a fine-grain microstructure and a limited diffusion zone in the article surface.

14 Claims, 4 Drawing Sheets

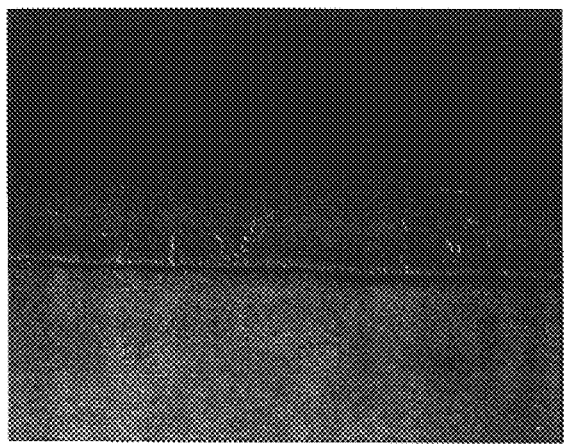 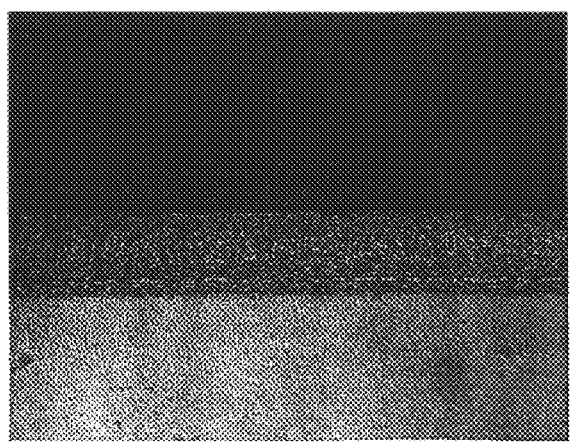
50μm
FIGURE 4
FIGURE 5

US 6,255,001 B1

BOND COAT FOR A THERMAL BARRIER COATING SYSTEM AND METHOD THEREFOR

CROSS-REFERENCE TO RELATED APPLICATIONS

This is a continuation-in-part patent application of U.S. patent application Ser. No. 08/932,304 filed on Sep. 17, 1997, now abandoned.

FIELD OF THE INVENTION

This invention relates to a bond coat for thermal barrier coating systems of the type used to protect components exposed to high temperature environments, such as the hostile thermal environment of a gas turbine engine. More particularly, this invention is directed to a thermal barrier coating system that includes a fine-grain NiAl bond coat deposited by a physical vapor deposition technique and on which a thermal insulating ceramic layer is deposited, wherein the thermal life of the coating system is greatly enhanced by the fine grain structure of the bond coat and very limited additions of zirconium to the bond coat material.

BACKGROUND OF THE INVENTION

Higher operating temperatures for gas turbine engines are continuously sought in order to increase their efficiency. However, as operating temperatures increase, the high temperature durability of the components of the engine must correspondingly increase. Significant advances in high temperature capabilities have been achieved through formulation of iron, nickel and cobalt-base superalloys, though such alloys alone are often inadequate to form components located in certain sections of a gas turbine engine, such as the turbine, combustor and augmentor. A common solution is to thermally insulate such components in order to minimize their service temperatures. For this purpose, thermal barrier coatings (TBC) formed on the exposed surfaces of high temperature components have found wide use.

To be effective, thermal barrier coatings must have low thermal conductivity, strongly adhere to the article, and remain adherent throughout many heating and cooling cycles. The latter requirement is particularly demanding due to the different coefficients of thermal expansion between materials having low thermal conductivity and superalloy materials typically used to form turbine engine components. Thermal barrier coating systems capable of satisfying the above requirements have generally required a metallic bond coat deposited on the component surface, followed by an adherent ceramic layer that serves to thermally insulate the component. Metal oxides, such as zirconia ($ZrO_2$) that is partially or fully stabilized by yttria ($Y_2O_3$), magnesia (MgO) or other oxides, have been widely employed as the material for the thermal-insulating ceramic layer. The ceramic layer is typically deposited by air plasma spraying (APS), low pressure plasma spraying (LPPS), or a physical vapor deposition (PVD) technique, such as electron beam physical vapor deposition (EBPVD) which yields a strain-tolerant columnar grain structure. Bond coats are typically formed of an oxidation-resistant aluminum-based intermetallic such as a diffusion aluminide or platinum aluminide, or an oxidation-resistant aluminum-containing alloy such as MCrAlY (where M is iron, cobalt and/or nickel).

As known in the art, MCrAlY bond coats are typically formed by plasma spraying, electron beam physical vapor deposition (EBPVD) and sputtering, and have a typical grain size of about 10 to 20 micrometers. Diffusion aluminide bond coats are generally formed by a diffusion process such as pack cementation, vapor phase (gas phase) aluminiding (VPA), or chemical vapor deposition (CVD). Diffusion processes react the surface of a component with an aluminum-containing composition to form two distinct zones, the outermost of which is an additive layer that contains the environmentally-resistant intermetallic phase NiAl. Beneath the additive layer is a diffusion zone (DZ) comprised of NiAl and secondary phases such as $Ni_3Al$ ($\gamma'$), solid-solutioned nickel ($\gamma$), carbides and sigma phases. A typical grain size for the outermost additive layer is about 20 to 50 micrometers.

The aluminum content of the above-noted bond coat materials provides for the slow growth of a strong adherent continuous aluminum oxide layer (alumina scale) at elevated temperatures. This thermally grown oxide (TGO) protects the bond coat from oxidation and hot corrosion, and chemically bonds the ceramic layer to the bond coat. Though bond coat materials are particularly alloyed to be oxidation-resistant, the oxidation that occurs over time at elevated temperatures gradually depletes aluminum from the bond coat. Eventually, the level of aluminum within the bond coat is sufficiently depleted to prevent further slow growth of the protective oxide, and to allow for the more rapid growth of nonprotective oxides. At such time, spallation may occur at the interface between the bond coat and the aluminum oxide layer or the interface between the oxide layer and the ceramic layer.

In addition to depletion of aluminum, the ability of the bond coat to form the desired aluminum oxide layer can be hampered by the interdiffusion of elements between the superalloy and bond coat, such as during formation of a diffusion aluminide coating and during high temperature exposure. In particular, elements such as nickel, cobalt, chromium, titanium, tantalum, tungsten and molybdenum can increase the growth rate of aluminum oxide and form voluminous, nonadherent oxides or oxide scales that may be deleterious to the adhesion of the ceramic layer.

From the above, it is apparent that the service life of a thermal barrier coating is dependent on the bond coat used to anchor the thermal insulating ceramic layer. Once spallation of the ceramic layer has occurred, the component must be scrapped or refurbished at considerable cost by removing the remaining ceramic layer and bond coat, including any diffusion zone between the bond coat and substrate. Because removal of the diffusion zone effectively removes a portion of the substrate surface, a limited number of repairs can be performed before the component must be scrapped. In view of the considerable cost to repair and replace thermal barrier coating systems, there has been a considerable and continuous effort to increase their service life by improving the spallation resistance of the thermal insulating layer. However, such efforts have been complicated by the demand for higher service temperatures for gas turbine engines.

SUMMARY OF THE INVENTION

The present invention generally provides a thermal barrier coating system and a method for forming the coating system on an article designed for use in a hostile thermal environment, such as turbine, combustor and augmentor components of a gas turbine engine. The method is particularly directed to increasing the spallation resistance of a thermal barrier coating system with a bond coat that exhibits significantly improved oxidation resistance.

The thermal barrier coating system of this invention employs a bond coat of a nickel aluminide alloy over which a thermal-insulating ceramic layer is deposited, with the bond coat serving the traditional role of promoting adhesion of the ceramic layer to the article. According to the invention, the nickel aluminide bond coat is formed to have a fine grain structure and contains zirconium, but is otherwise predominantly of the beta (β) NiAl phase. As with prior art aluminum-containing bond coats, the bond coat of this invention develops a continuous aluminum oxide layer that promotes the adhesion of the ceramic layer to the bond coat. The bond coat is deposited by a physical vapor deposition process (PVD), such as by magnetron sputtering, electron beam physical vapor deposition (EBPVD) and jet vapor deposition (JVD), though other deposition processes are possible, such as vacuum plasma spray (VPS), low pressure plasma spray (LPPS), air plasma spray (APS) and high-velocity oxy-fuel (HVOF) spray deposition. The ceramic layer can be deposited on the bond coat by known techniques, including plasma spraying and PVD techniques. An aluminum oxide layer is preferably grown on the bond coat, either by heat treatment prior to deposition of the bond coat or during deposition of the ceramic layer.

A key feature of this invention is that the bond coat is not a traditional diffusion aluminide or MCrAlY coatings, but instead is a NiAl alloy consisting essentially of nickel and aluminum and containing zirconium in a very limited amount that, when present in a fine grain microstructure with an average grain size of less than three micrometers, has been unexpectedly found to drastically increase the service life of the thermal barrier coating system. In particular, zirconium additions of at least 0.2 atomic percent have been shown to significantly improve the life of a thermal barrier coating system by a factor of about two to in excess of ten when subjected to thermal cycle testing, with the best results appearing to be obtained in the range of 0.2 to 0.5 atomic percent zirconium. The sensitivity that thermal life has for the zirconium content of the NiAl bond coat is particularly evident with increasing test temperatures, indicating that the bond coat of this invention is particularly advantageous for more demanding applications.

Another important aspect of the invention is that the bond coat is deposited in such a manner as to minimize diffusion of the bond coat constituents into the surface of the article. For example, a diffusion zone of not more than five micrometers is preferably achieved by the preferred PVD techniques. This reduced level of interaction between the bond coat and substrate promotes the formation of an initial layer of essentially pure aluminum oxide, promotes the slow growth of the protective aluminum oxide layer during service, and reduces the formation of voluminous nonadherent oxides of substrate constituents that tend to diffuse into the bond coat. Importantly, by limiting diffusion of the bond coat into the substrate, minimal substrate material must be removed during refurbishment of the thermal barrier coating system, when both the bond coat and thermal-insulating ceramic layer must be removed to allow deposition of a new bond coat and ceramic layer on the substrate.

Other objects and advantages of this invention will be better appreciated from the following detailed description.

DESCRIPTION OF THE DRAWINGS

FIGS. 4 and 5 are photomicrographs showing coarse and fine grain NiAl+Zr bond coats on superalloy specimens prepared in accordance with this invention.

DETAILED DESCRIPTION OF THE INVENTION

Figure 1:
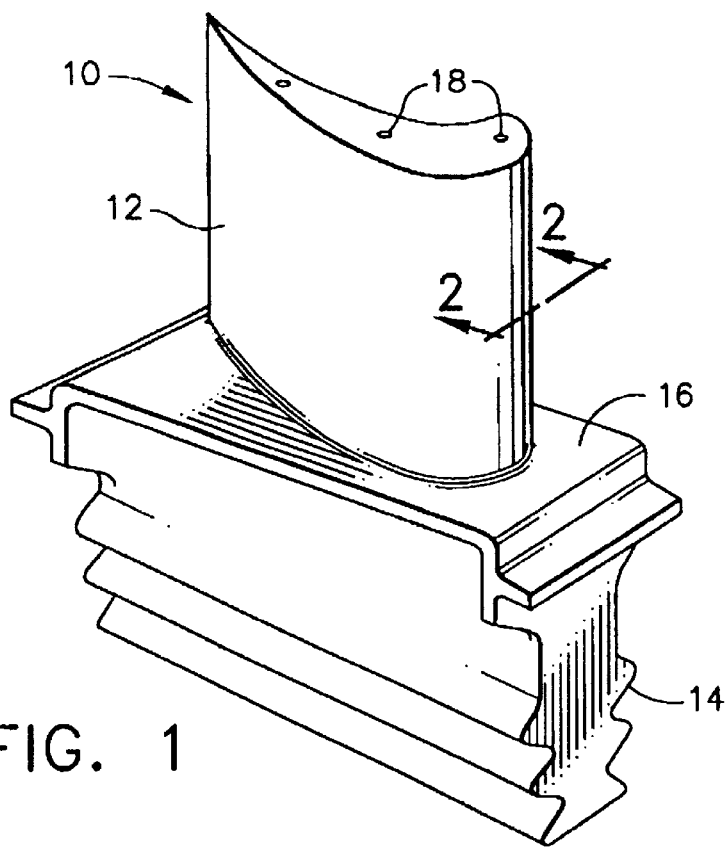
FIG. 1 is a perspective view of a high pressure turbine blade.

The present invention is generally applicable to components that operate within environments characterized by relatively high temperatures, and are therefore subjected to severe thermal stresses and thermal cycling. Notable examples of such components include the high and low pressure turbine nozzles and blades, shrouds, combustor liners and augmentor hardware of gas turbine engines. One such example is the high pressure turbine blade 10 shown in FIG. 1. The blade 10 generally includes an airfoil 12 against which hot combustion gases are directed during operation of the gas turbine engine, and whose surface is therefore subjected to severe attack by oxidation, corrosion and erosion. The airfoil 12 is anchored to a turbine disk (not shown) with a dovetail 14 formed on a root section 16 of the blade 10. Cooling passages 18 are present in the airfoil 12 through which bleed air is forced to transfer heat from the blade 10. While the advantages of this invention will be described with reference to the high pressure turbine blade 10 shown in FIG. 1, the teachings of this invention are generally applicable to any component on which a thermal barrier coating system may be used to protect the component from its environment.

Figure 2:
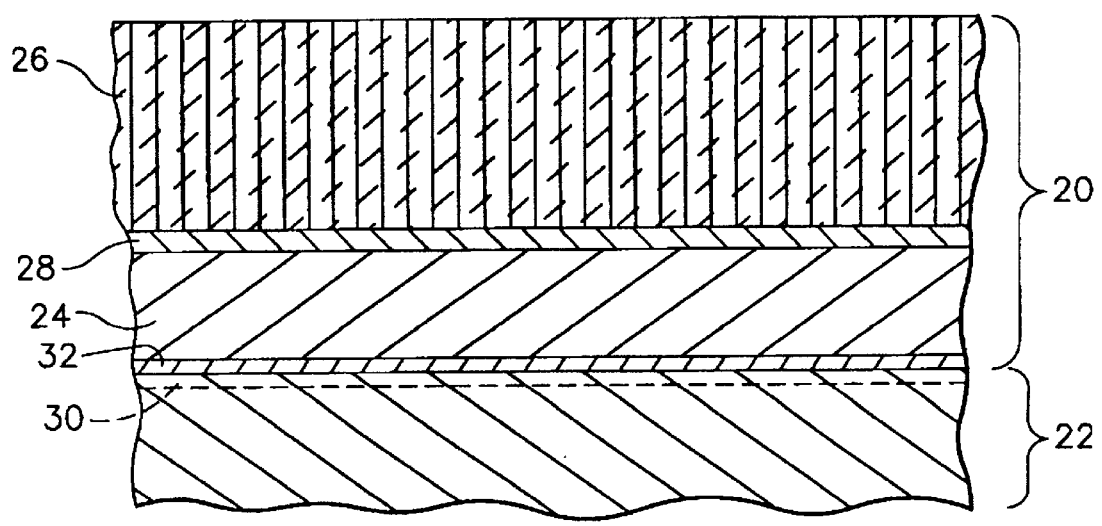
FIG. 2 is a cross-sectional view of the blade of FIG. 1 along line 2—2, and shows a thermal barrier coating system that includes a fine-grain NiAl+Zr bond coat in accordance with this invention.

Represented in FIG. 2 is a thermal barrier coating system 20 in accordance with this invention. As shown, the coating system 20 includes a ceramic layer 26 bonded to the blade substrate 22 with a bond coat 24. The substrate 22 (blade 10) is preferably a high-temperature material, such as an iron, nickel or cobalt-base superalloy. To attain a strain-tolerant columnar grain structure, the ceramic layer 26 is preferably deposited by physical vapor deposition (PVD), though other deposition techniques could be used. A preferred material for the ceramic layer 26 is an yttria-stabilized zirconia (YSZ), with a preferred composition being about 6 to about 8 weight percent yttria, though other ceramic materials could be used, such as yttria, nonstabilized zirconia, or zirconia stabilized by ceria ($CeO_2$), scandia ($Sc_2O_3$) or other oxides. The ceramic layer 26 is deposited to a thickness that is sufficient to provide the required thermal protection for the underlying substrate 22 and blade 10, generally on the order of about 125 to about 300 micrometers. As with prior art thermal barrier coating systems, the surface of the bond coat 24 oxidizes to form an aluminum oxide layer 28 to which the ceramic layer 26 chemically bonds.

According to the invention, the bond coat 24 is a nickel aluminide alloy of predominantly the beta (β) NiAl phase with a fine grain structure and a very limited addition of zirconium. The NiAl bond coat 24 is formed using a PVD process, preferably sputtering, electron beam physical vapor deposition (EBPVD) or jet vapor deposition (JVD), though it is foreseeable that other deposition techniques could be used, such as plasma spraying. According to the invention, an adequate thickness for the NiAl bond coat 24 is about fifty micrometers in order to protect the underlying substrate 22 and provide an adequate supply of aluminum for oxide formation, though thicknesses of about 20 to about 125 micrometers are believed to be suitable.

The preferred PVD techniques are preferably carried out to reduce the diffusion of the bond coat 24 into the substrate 22. Preferably, deposition of the bond coat 24 results in virtually no diffusion between the bond coat 24 and substrate 22. During subsequent heat treatment to relieve residual stresses generated during the deposition process, a very thin diffusion zone 30 of not more than above five micrometers, typically about 2.5 to 5 micrometers, may develop. A preferred heat treatment is conducted at about 1800° F. (about 980° C.) for about two to four hours in an inert atmosphere, such as argon. Importantly, the minimal thickness of the diffusion zone 30 promotes the initial formation of the oxide layer 28 as essentially pure aluminum oxide, promotes the slow growth of the protective aluminum oxide layer 28 during service, reduces the formation of voluminous nonadherent oxides at the bond coat-ceramic layer interface, and reduces the amount of substrate material that must be removed during refurbishment of the thermal barrier coating system 20. Accordingly, articles such as the blade 10 shown in FIG. 1 can be refurbished more times than would be possible if a traditional bond coat were used.

According to this invention, the NiAl bond coat 24 is a NiAl alloy consisting essentially of nickel and aluminum and containing zirconium in a very limited amount that, when present in a fine grain microstructure with an average grain size of less than three micrometers, has been unexpectedly found to drastically increase the service life of the thermal barrier coating system. In particular, NiAl bond coats containing between about 0.2 and about 0.5 atomic percent zirconium have been shown to drastically improve the life, i.e., increase the spallation resistance, of a thermal barrier coating system.

Figure 3:
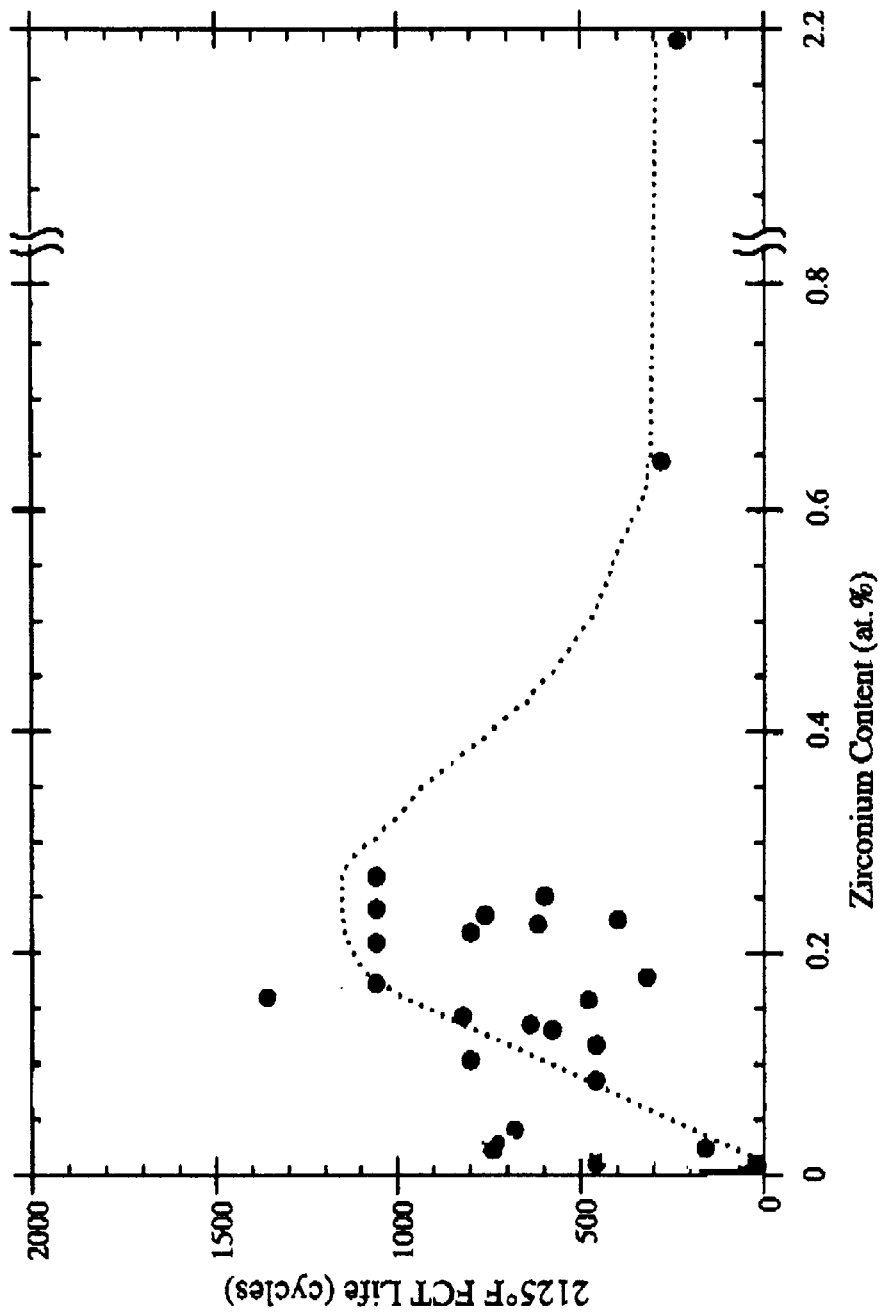
FIG. 3 is a graph relating furnace cycle life to zirconium content of thermal barrier coatings on NiAl+Zr bond coats deposited on superalloy specimens in accordance with this invention.

During an investigation leading to this invention, specimens of a nickel-base superalloy were provided with thermal barrier coating systems that included bond coats over which ceramic topcoats of 7% yttria-stabilized zirconia (YSZ) were deposited by EBPVD to a thickness of about 125 micrometers. The superalloy was René N5 having a nominal composition, in weight percent, of Ni-7.5Co-7.0Cr-6.5Ta-6.2Al-5.0W-3.0Re-1.5Mo-0.15Hf-0.05C-0.004B-0.01Y. As indicated in FIG. 3, the bond coats were formulated to be essentially βNiAl and. contain zirconium at levels of up to 2.2 atomic percent. All of the bond coats were deposited by an EBPVD technique to have a thickness of between about 20 and 50 micrometers.

Spallation resistance of the YSZ topcoats was then evaluated by furnace cycle testing (FCT) between room temperature and about 2125° F. (about 1163° C.), with a full cycle being completed in about one hour. Testing of any given specimen was terminated when about 20% of the ceramic topcoat had spalled. The results of these tests are summarized in FIG. 3, which shows that the ceramic topcoats deposited on specimens with NiAl+Zr bond coats containing about 0.1 up to about 0.3 atomic percent zirconium were significantly more resistant to spallation than those deposited on NiAl bond coats with lower and higher zirconium contents. Notably, the spallation lives for the specimens with bond coats containing 0.1 to 0.3 atomic percent zirconium were also about 2× to over 8× greater than specimens with identical substrates and ceramic topcoats but prepared with diffusion platinum aluminide bond coats.

A regression analysis was then performed on those specimens with NiAl bond coats containing less than 0.3 atomic percent zirconium, which yielded the following regression equation:

$$\text{FCT Cycles} = 20694 - 5.90[t] + 221[Ni] + 205[Al] + 584[Zr]$$

where "t" is bond coat thickness in micrometers, and Ni, Al and Zr are the amounts of nickel, aluminum and zirconium present in atomic percent. The analysis showed that zirconium content had a positive effect on thermal fatigue life of a TBC. However, the coefficient for zirconium had a standard deviation of about 333, evidencing that something else strongly effected the degree to which zirconium content improved fatigue life. Upon examining the microstructures of the specimens, it was determined that grain size also strongly effected FCT life. As examples, FIGS. 4 and 5 are microphotographs of two of the NiAl+Zr specimens containing 0.12 atomic percent zirconium. The specimen of FIG. 4 had an average grain size of about fifty micrometers, while the specimen of FIG. 5 had an average grain size of less than one micrometer. The coarse-grained specimen of FIG. 4 had a test life of 460 cycles, while the fine-grained specimen had a test life of 780 cycles—a significant improvement. From this, it was concluded that a preferred NiAl+Zr bond coat should have at least a portion characterized by a grain size of less than one micrometer.

Figure 6:
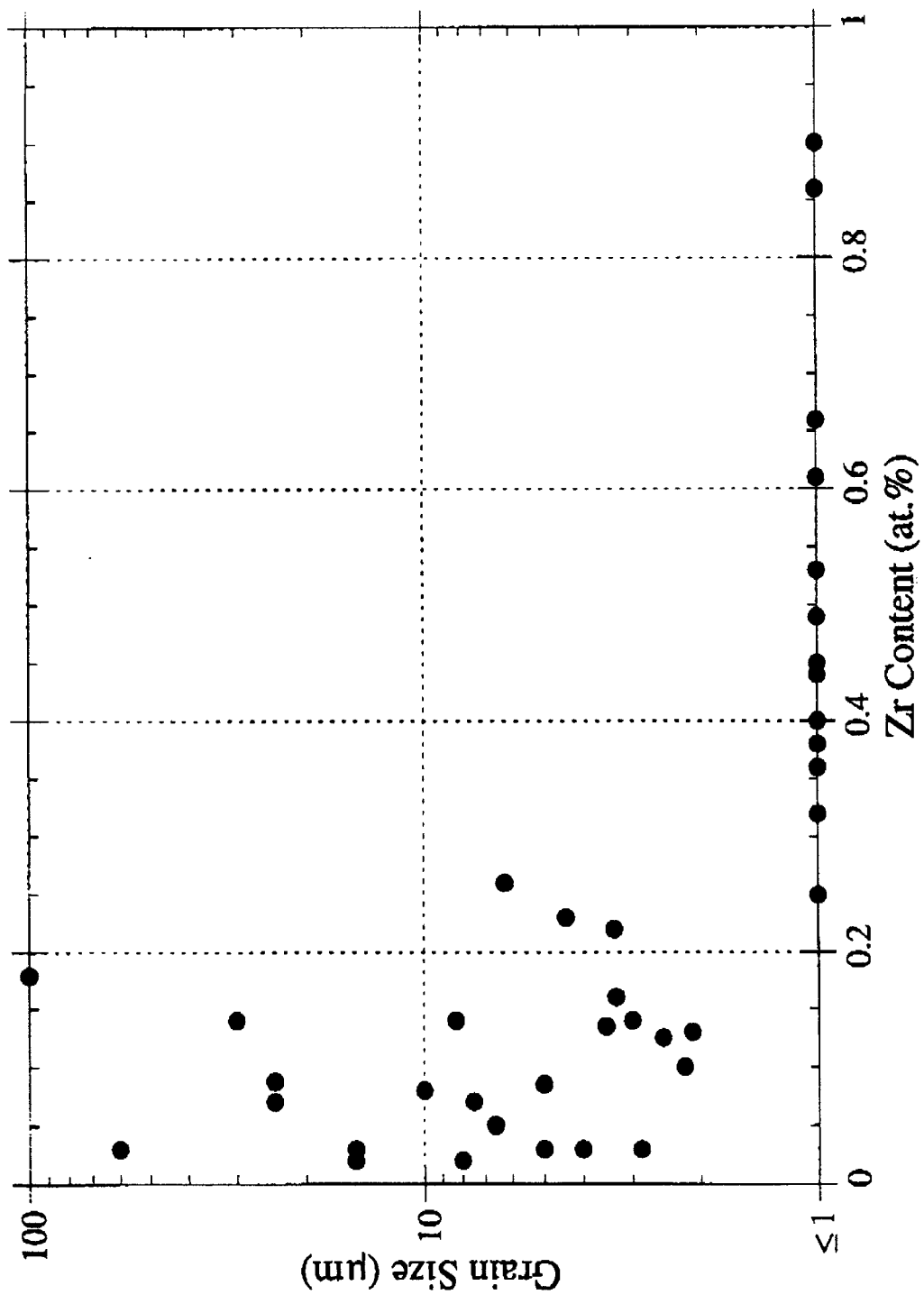
FIG. 6 is a graph relating grain size to zirconium content of bond coats deposited on superalloy specimens in accordance with this invention.

Surprisingly, as evidenced by FIG. 6, PVD NiAl bond coats with zirconium contents of greater than 0.2 atomic percent consistently had average grain sizes of one micrometer or less, while those specimens containing 0.2 atomic percent or less of zirconium typically had average grain sizes of two micrometers or more. Taking into consideration the positive effect of a fine-grain microstructure and zirconium content, it was concluded that improved FCT life could reliably be achieved with zirconium contents of about 0.2 atomic percent up to about 0.5 atomic percent.

While our invention has been described in terms of a preferred embodiment, it is apparent that other forms could be adopted by one skilled in the art. Accordingly, the scope of our invention is to be limited only by the following claims.

What is claimed is:

1. A component having a thermal barrier coating system on a surface thereof, the thermal barrier coating system comprising:
   a bond coat deposited on the surface of the component by a physical vapor deposition technique, wherein the bond coat comprises a NiAl alloy of predominantly the beta phase, contains at least 0.2 atomic percent zirconium, and has an average grain size of less than 3 micrometers; and
   a thermal-insulating ceramic layer overlying the bond coat.

2. A component as recited in claim 1, wherein the nickel aluminide alloy contains 0.2 up to about 0.5 atomic percent zirconium.

3. A component as recited in claim 1, wherein the thermal barrier coating system consists of the bond coat, the ceramic layer and an oxide layer therebetween.

4. A component as recited in claim 1, wherein the component is formed of a superalloy.

5. A component as recited in claim 1, further comprising a diffusion zone in the surface of the component beneath the bond coat, the diffusion zone having a thickness of up to five micrometers.

6. A gas turbine engine component formed of a nickel-base superalloy and having a thermal barrier coating system on a surface thereof, the thermal barrier coating system comprising:
   a bond coat deposited on the surface of the component by a physical vapor deposition technique, wherein the bond coat comprises a NiAl alloy of predominantly the beta phase, contains at least 0.2 atomic percent zirconium, and has an average grain size of less than 3 micrometers;
   a diffusion zone in the surface of the component beneath the bond coat, the diffusion zone having a thickness of up to five micrometers;

an aluminum oxide layer on the bond coat; and a ceramic layer on the aluminum oxide layer.

7. A component as recited in claim 6, wherein the bond coat contains at least 0.2 to about 0.5 atomic percent zirconium.

8. A component as recited in claim 6, wherein the bond coat has a thickness of about 20 to about 125 micrometers.

9. A component as recited in claim 6, wherein the thermal barrier coating system consists of the bond coat, the diffusion zone, the aluminum oxide layer, and the ceramic layer.

10. A method for forming a thermal barrier coating system on a surface of a component, the method comprising the steps of:

depositing a bond coat on the surface of the component by a physical vapor deposition technique selected from the group consisting of magnetron sputtering, electron beam physical vapor deposition, jet vapor deposition and plasma spraying wherein the bond coat comprises a NiAl alloy of predominantly the beta phase, contains at least 0.2 atomic percent zirconium, and has an average grain size of less than 3 micrometers; and depositing a thermal-insulating ceramic layer on the bond coat.

11. A method as recited in claim 10, wherein the nickel aluminide alloy contains 0.2 up to about 0.5 atomic percent zirconium.

12. A method as recited in claim 10, further comprising the step of forming an oxide layer on the bond coat prior to deposition of the thermal-insulating ceramic layer.

13. A method as recited in claim 10, wherein the component is formed of a superalloy.

14. A method as recited in claim 10, further comprising the step of heat treating the bond coat, during which a diffusion zone having a thickness of not more than five micrometers is produced in the surface of the component beneath the bond coat.

* * * * *